United States Patent
Brand et al.

[11] Patent Number: 6,101,102
[45] Date of Patent: Aug. 8, 2000

[54] FIXED FREQUENCY REGULATION CIRCUIT EMPLOYING A VOLTAGE VARIABLE DIELECTRIC CAPACITOR

[75] Inventors: Michael Brand, Los Angeles; Thomas Kirk Dougherty, Playa del Ray; John J. Drab, Santa Barbara; Brian M. Pierce, Moreno Valley, all of Calif.

[73] Assignee: Raytheon Company, Lexington, Mass.

[21] Appl. No.: 09/300,962

[22] Filed: Apr. 28, 1999

[51] Int. Cl.⁷ .............................. H02M 1/00; H02M 1/12; H02M 1/14

[52] U.S. Cl. .................................................. 363/15; 363/40

[58] Field of Search .................... 363/15, 40, 95, 363/97, 131

[56] References Cited

U.S. PATENT DOCUMENTS

| | | | |
|---|---|---|---|
| 4,605,999 | 8/1986 | Bowman et al. | 363/19 |
| 4,685,041 | 8/1987 | Bowman et al. | 363/40 |
| 5,504,668 | 4/1996 | Beyerlein et al. | 363/95 |
| 5,708,573 | 1/1998 | Lusher et al. | 363/47 |
| 5,768,111 | 6/1998 | Zaitsu | 363/15 |

*Primary Examiner*—Shawn Riley
*Assistant Examiner*—Bao Q. Vu
*Attorney, Agent, or Firm*—Leonard A. Alkov; Glenn H. Lenzen, Jr.

[57] ABSTRACT

Frequency regulating apparatus comprising a high power, voltage variable dielectric varactor or capacitor (or ferroelectric voltage variable dielectric capacitor) for use as a control element in the regulation circuit that actively tunes a resonant network to modulate power delivered to a load. The voltage variable dielectric capacitor comprises a substrate having a bottom electrode 33 formed thereon. A dielectric material is disposed on the substrate is a crystallized ceramic material that preferably comprises a barium, strontium, and titanium mixture. A top electrode is disposed on top of the crystallized ceramic material. Methods of fabricating the voltage variable dielectric varactor (capacitor) are also disclosed.

10 Claims, 2 Drawing Sheets

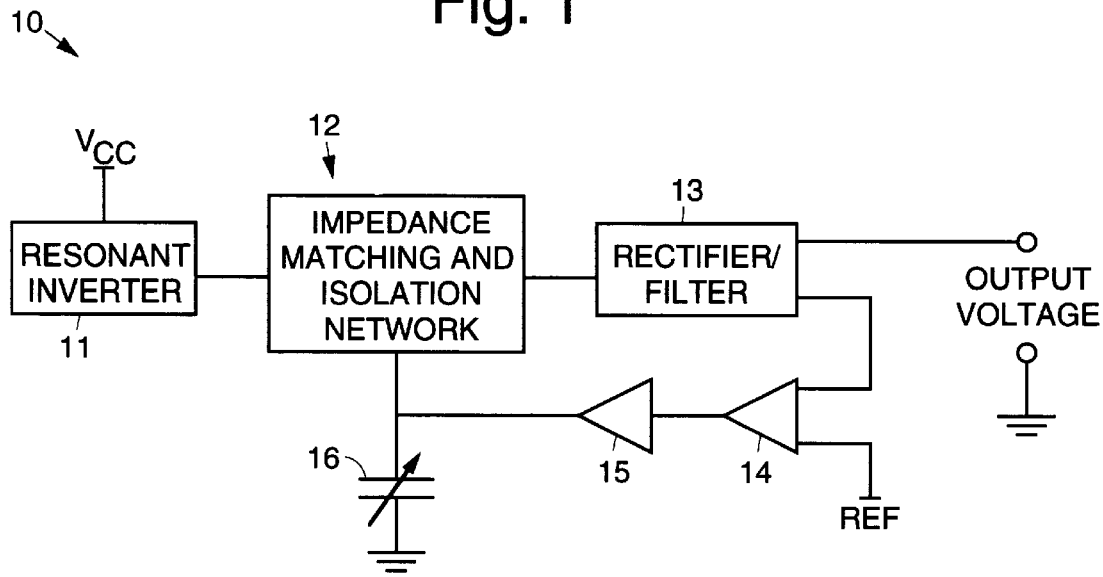
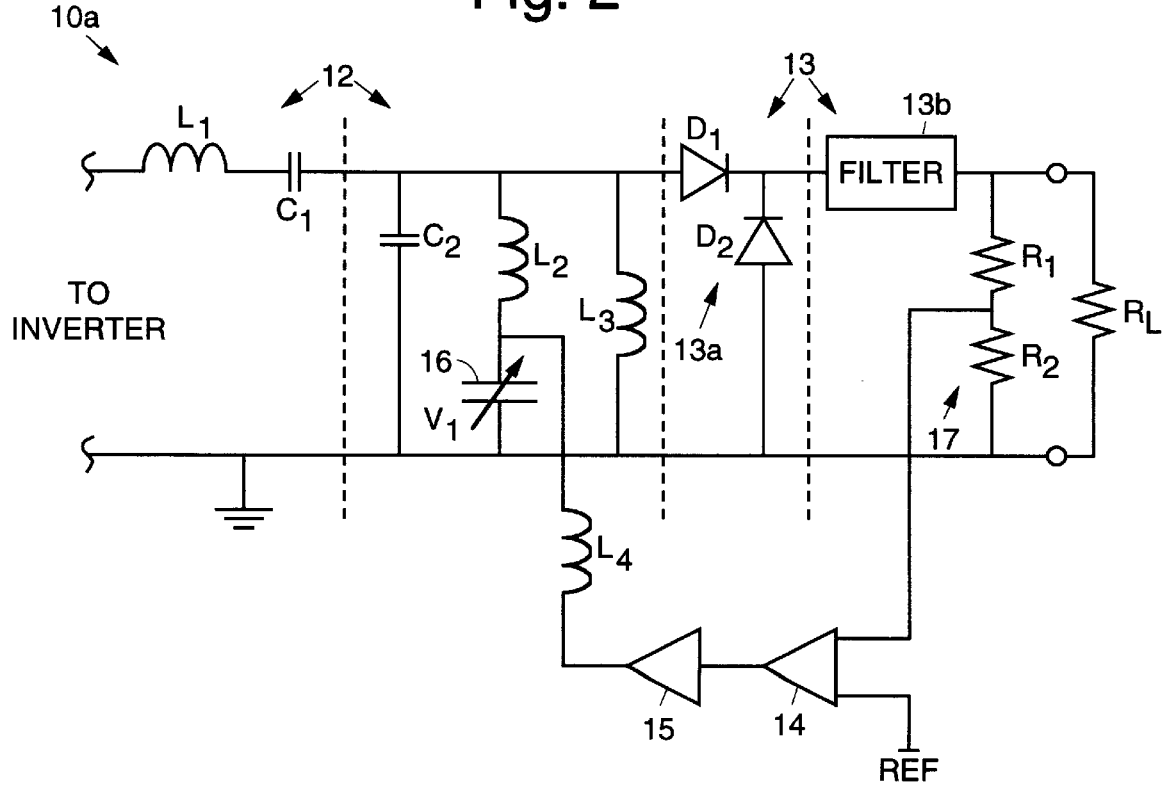

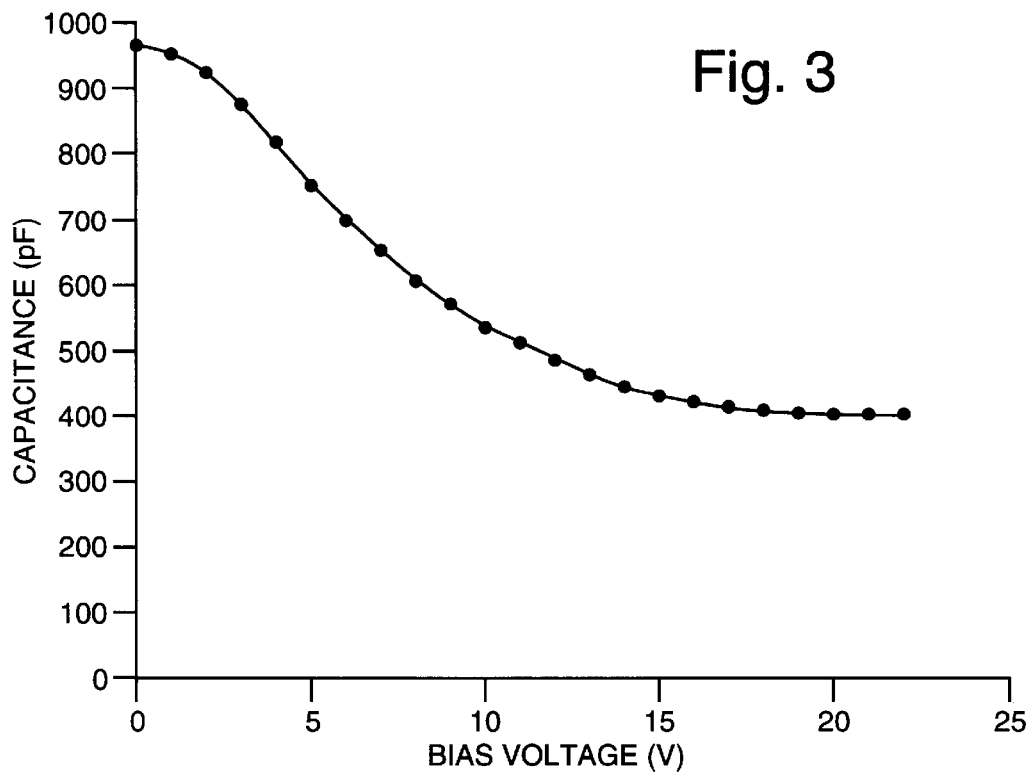
Fig. 3
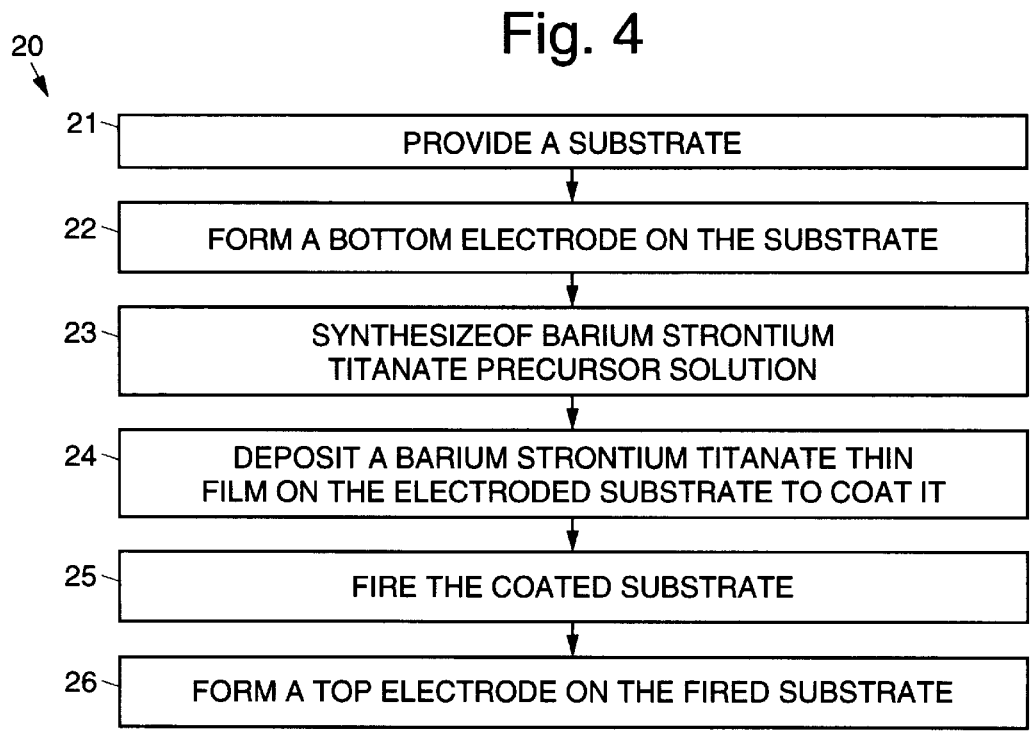
Fig. 4
- 21 — PROVIDE A SUBSTRATE
- 22 — FORM A BOTTOM ELECTRODE ON THE SUBSTRATE
- 23 — SYNTHESIZEOF BARIUM STRONTIUM TITANATE PRECURSOR SOLUTION
- 24 — DEPOSIT A BARIUM STRONTIUM TITANATE THIN FILM ON THE ELECTRODED SUBSTRATE TO COAT IT
- 25 — FIRE THE COATED SUBSTRATE
- 26 — FORM A TOP ELECTRODE ON THE FIRED SUBSTRATE
Fig. 5
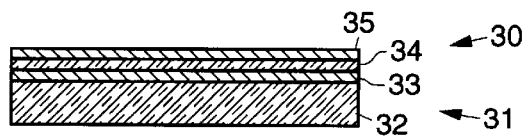

FIXED FREQUENCY REGULATION CIRCUIT EMPLOYING A VOLTAGE VARIABLE DIELECTRIC CAPACITOR

BACKGROUND

The present invention relates generally to high frequency resonant DC—DC converters, and more particularly, to an improved voltage variable capacitor or varactor for use in regulating such high frequency resonant DC—DC converters.

The assignee of the present invention has heretofore developed a high frequency DC—DC converter to meet the demanding cost and performance requirements of high power, high frequency electronic systems such as active arrays and high speed processors. One such high frequency DC—DC converter is disclosed in U.S. Pat. No. 5,410,276, entitled "RP modulation using a pulsed DC power supply", assigned to the assignee of the present invention The concepts presented in U.S. Pat. No. 5,410,276 were improved upon in U.S. Pat. No. 5,708,573 entitled "Varactor controlled fixed frequency VHF DC—DC converter". In the VHF DC—DC converter disclosed in this patent, the variable capacitance for regulation is created using a semiconductor varactor diode that is reverse-biased to create a variable "capacitor". This device must remain reverse-biased to remain functional in the circuit and to give a 2:1 change of capacitance.

In this converter, the semiconductor varactor diode must be reverse-biased to at least 70 volts, and as high as 100 volts, to remain a variable capacitor in the circuit. This high voltage control bias results in the need for an expensive Application Specific Integrated Circuit (ASIC), and additional circuitry in the DC—DC converter. The use of the high voltage biased varactor semiconductor diode results in increased cost and size of the DC—DC converter.

It would therefore be desirable to regulate a power converter in a manner that decreases circuit complexity, cost, weight and improves the performance thereof. Accordingly, it is an objective of the present invention to provide for an improved voltage variable capacitor or varactor for use in he regulation of high frequency resonant DC—DC converters.

SUMMARY OF THE INVENTION

To meet the above and other objectives, the present invention is a new approach for providing fixed frequency regulation of a resonant converter. The heart of the invention is the use of a high power, voltage variable dielectric capacitor (or ferroelectric voltage variable dielectric capacitor) as a control element in the regulation circuit. This device, combined with a feedback and control circuit, serves to actively tune the resonant network of the converter and thereby modulate power delivered to a load. The feedback circuit senses the converter output voltage and generates an appropriate control signal to adjust the capacitance as necessary to regulate the output voltage.

Use of the voltage variable dielectric capacitor significantly reduces the complexity, size, and cost of the regulation control circuitry. This is possible because, unlike a conventional varactor diode, the voltage variable dielectric capacitor does not require a high voltage bias (on the order of 100 VDC) to ensure capacitor behavior throughout its operating cycle. The use of the present ferroelectric voltage variable dielectric capacitor to regulate the DC—DC converter improves the overall performance of the DC—DC converter.

More specifically, the present invention provides for a regulating apparatus for use in a regulation circuit. The regulating apparatus comprises a voltage variable dielectric capacitor which is preferably a ferroelectric capacitor. The voltage variable dielectric capacitor comprises a substrate having an electrode formed thereon. A dielectric material is disposed on the substrate that preferably comprises a crystallized ceramic material. The ceramic material may preferably be made of a mixture of decomposed thermally-treated barium, strontium, and titanium metal organic salts. A top electrode is disposed on top of the crystallized ceramic material.

In producing a preferred embodiment of the invention, a precursor solution of soluble barium, strontium, and titanium metal organic salts are dissolved in appropriate solvent and it proper concentration and applied to a substrate having an electrode formed thereon. The solvents are removed by drying and the process is repeated until the desired thickness of the dielectric material is deposited. The coated electroded substrate is then fired at elevated temperature to remove or decompose the organic portion and crystallize the ceramic. A top electrode is then applied to the ceramic and the capacitor is completed. The capacitor is then attached to the high frequency power converter by wire bonding or the like. The capacitor shows the expected variable capacitance with applied voltage.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which:

FIG. 1 illustrates a generalized block diagram of a DC—DC converter incorporating a voltage variable dielectric varactor regulation circuit in accordance with the principles of the present invention;

FIG. 2 illustrates an exemplary series-shunt voltage variable dielectric regulation circuit in accordance with the principles of the present invention;

FIG. 3 illustrates a graph of capacitance versus bias voltage for a typical thin film varactor in accordance with the principles of the present invention;

FIG. 4 is a flow diagram that illustrates a method of making a voltage variable dielectric capacitor in accordance with the principles of the present invention; and FIG. 5 illustrates the frequency regulating apparatus in accordance with the principles of the present invention comprising a voltage variable dielectric capacitor.

DETAILED DESCRIPTION

As was mentioned above, the high frequency power converter developed by the assignee of the present invention and disclosed in U.S. Pat. No. 5,708,573 employs a variable capacitance for regulation that is created using a semiconductor varactor diode that is reverse-biased to create a variable "capacitor". The present invention provides for an improved voltage variable dielectric capacitor 31 (FIG. 5) or varactor 16 for use in this and other high frequency power converters.

Referring to the drawing figures, FIG. 1 illustrates a generalized block diagram of a DC—DC converter 10, or fixed frequency resonant converter 10, incorporating a voltage variable dielectric varactor regulation circuit in accordance with the principles of the present invention. FIG. 1 illustrates a general application of the present voltage variable dielectric varactor 16 which converts an unregulated source voltage (Vcc) derived from a resonant inverter 11 into a sinusoidal power waveform. The sinusoidal waveform is transformed in amplitude (increased or decreased) and impedance matched using an impedance matching and isolation network 12 (that includes the voltage variable dielectric varactor 16) and a rectifier/filter 13. Thus, power is effectively transferred from the inverter 11 to the rectifier/filter 13. The rectifier/filter 13 converts the sinusoidal power waveform back to DC and filters residual noise from the power waveform. The output of the DC—DC converter 10 is sensed by an error amplifier 14 and compared with a reference voltage to generate an error signal. The error signal is amplified by a driver 15 which generates a variable bias necessary to control a voltage variable dielectric varactor 16. The varactor 16 is an integral element of the impedance matching and isolation network 12. By modulating the value of the capacitance of the voltage variable dielectric varactor 16, the transfer function of the impedance matching and isolation network 12 is adjusted. By adjusting the transfer function, the amplitude of the power waveform passing through the impedance matching and isolation network 12 is varied. The output voltage from the DC—DC converter 10 is directly proportional to the amplitude of the sinusoidal power waveform passing through the impedance matching and isolation network 12. Thus, by modulating the value of the capacitance of the varactor 16, adjustment of the output voltage in response to variations of the input voltage and output load is accomplished.

FIG. 2 illustrates an exemplary series-shunt voltage variable dielectric regulation circuit 10a in accordance with the principles of the present invention that illustrates an embodiment of the DC—DC converter 10 shown in FIG. 1. In the voltage variable dielectric regulation circuit 10a shown in FIG. 2, a varactor 16 ($V_1$) is connected in a series-shunt configuration. However, it is to be understood that other configurations may also be provided, including series-parallel and parallel configurations. In the voltage variable dielectric regulation circuit 10a a first inductor ($L_1$) and a first capacitor ($C_1$) form part of a resonant inverter network 11. A second capacitor ($C_2$), second and third inductors ($L_2$, $L_3$) and a varactor ($V_1$) form an impedance matching and isolation network 12. A rectifier 13a comprising first and second rectifier diodes ($D_1$, $D_2$) are disposed between the impedance matching and isolation networked and a filter 13b. First and second resistors ($R_1$, $R_2$) form a resistor divider 17 which are in parallel with a load ($R_L$). A fourth inductor ($L_4$) isolates the high frequency converter waveform from the low frequency regulation control signal.

In operation, the inverter waveform passes through the resonant inverter network 11 comprising the first inductor ($L_1$) and first capacitor ($C_1$) to the impedance matching network 12. The impedance matching and isolation network 12 comprising the second capacitor ($C_2$), second and third inductors ($L_2$, $L_3$) and varactor ($V_1$) transform the inverter waveform to a level necessary to maintain the required voltage at the output across the load ($R_L$). The rectifier 13a comprising the first and second rectifier diodes ($D_1$, $D_2$) convert the sinusoidal waveform into a DC signal. The DC signal passes through the filter 13b where unwanted noise is removed. The resistor divider 17 ($R_1$, $R_2$) samples the output voltage. The sampled signal passes through a feedback loop comprising an error amplifier 14, driver 15, and fourth inductor ($L_4$) where it is used to control the value of the voltage variable dielectric varactor 16. The varactor ($V_1$) in conjunction with the second inductor ($L_2$) forms a variable inductance. This variable inductance creates in conjunction with the second capacitor ($C_2$) a variable capacitance. It is the ratio of the first capacitor ($C_1$) and the effective capacitance ($C_2$) that results in the impedance transformation. By varying the effective value of the second capacitance ($C_2$), the transformation ratio changes, thereby allowing the converter 10 to regulate the output voltage over varying input voltage levels and load values.

The voltage variable dielectric capacitor 31 (varactor 16) is a thin film ferroelectric capacitor 31. FIG. 3 illustrates a graph of capacitance versus bias voltage for a typical thin film capacitor 31 or varactor 16 in accordance with the principles of the present invention.

Replacing the semiconductor varactor diode and associated circuitry that provides for reverse bias with a simple thin film ferroelectric capacitor 31 (varactor 16) results in superior performance of the high frequency power converter 10. The ferroelectric capacitor 31 (varactor 16) does not require reverse bias. The thin film nature of the ferroelectric capacitor 31 (varactor 16) results in decreased control voltages and increased maximum tunability of the capacitor 31 (varactor 16). The improved performance compared with the semiconductor varactor diode and related circuitry used in the converter disclosed in U.S. Pat. No. 5,708,573 are summarized in the table below.

| Property | Semiconductor varactor diode | Thin film BST varactor |
|---|---|---|
| Capacitance | 600 pf | 600 pf |
| Q at 30 MHz | >100 | >100 (projected) |
| Bias voltage | 100 V | None Required |
| Area(sq. mil) | >40,000 | 100–1000 |
| Voltage for 50% change in capacitance | 28 V | 5 V |

The present ferroelectric capacitor 31 (varactor 16) replaces the biased semiconductor varactor diode in the VHF power converter 10. The ferroelectric capacitor 31 (varactor 16) is a thin film device that requires no bias voltage and provides tunable capacitance using just 5 to 10 volts total switching voltage. In comparison, the semiconductor varactor diode requires 100 volts bias and 28 volts switching voltage. To deliver these voltages, a complex circuit design including (ASICS) was used in the semiconductor varactor diode power converter disclosed in U.S. Pat. No. 5,708,573. The present invention utilizes the intrinsic variable capacitance of the thin film ferroelectric capacitor 31 (varactor 16) to reduce cost, simplify the circuit and increase performance.

More particularly, the active device of the present invention is a thin film ferroelectric capacitor 31 (varactor 16) used as a variable capacitor 31 (voltage tunable) to improve the high frequency power converter 10. The voltage variable capacitor 31 (varactor 16) is constructed using standard microelectronic processing techniques. A preferred embodiment of the present invention uses the material Ba(i-x) Sr(x) Ti O3 (BST), with x chosen to be about 0.5, as the active ferroelectric material. At this composition the material is in the paraelectric phase at the operating temperature and does not show hysteresis in the (P-E) characteristic. When operated as a paraelectric, the material shows a permittivity which varies as a function of applied voltage.

FIG. 4 is a flow diagram that illustrates a method 20 of making a voltage variable dielectric capacitor 31 (varactor 16) in accordance with the principles of the present invention. The preparation method 20 for a preferred embodiment of the voltage variable dielectric capacitor 31 (varactor 16) is as follows.

Substrate preparation 21 including bottom electrode evaporation 22.

A standard 20 mil thick silicon wafer was prepared with 5000 Angstroms of a wet thermal oxide (silicon). A 25 Angstrom thick tantalum (Ta) adhesion layer followed by a 1800 Angstrom thick platinum (Pt) layer were E-beam evaporated onto the substrate. The sheet resistance of the electrodes was 0.73 ohm/square. The electrodes were pre-annealed in oxygen for 30 min at 650 C to oxidize the tantalum layer and stabilize the platinum layer.

Synthesis 23 of barium strontium titanate precursor.

Barium and strontium 2-ethylhexanoate salts were produced by dissolving the appropriate metal in 2-ethylhexanoate acid with xylene as solvent. The titanium source was made by alkoxide acid exchange of titanium isopropoxide with the anhydride of 2-ethylhexanoic acid. The three solutions were mixed to give a nominal composition of $Ba_{0.50} Sr_{0.50} Ti_{1.01}$ (BST). The preferred solution for deposition contained 7.56% oxide ceramic with the solvents n-butyl acetate, xylene and the isopropyl ester of 2-ethylhexanoic acid in the ratio of 4 to 4 to 1.

Deposition 24 and firing 25 of barium strontium titanate thin film on electroded substrate.

Wafers were coated 24 with the BST solution described above on a standard spin coater using a 1400 rpm 30 second spin. Wafers were precleaned with toluene before each coat.

The wafers were hot plate baked 25 at 3 temperatures between each coat:

150° C. for 1 min, 250° C. for 4 min, and 320° C. for 2 min.

After the repeated spin coating and hot plate bakes the wafers were fired in mini-brute furnace in flowing oxygen at 700° C.

After firing, the wafers showed no signs of cracking and no adhesion failures. SEM analysis of the dielectric films showed the surface to be smooth. Thickness measurements showed the thickness to be approximately 3800 Angstroms.

Applying 26 the top electrode.

A 1000 Angstrom platinum (Pt) top electrode was deposited 26 through a shadow mask using varying top electrode sizes of approximately 10, 15, 20, 40, 80 and 160 mil diameter. The stack was fired at 650° C. for 30 minutes before it was electrically tested.

Initial electrical test.

The fabricated devices were tested on an analytical prober. Contact to the top electrode was made directly with a probe tip, contact to the bottom electrode was made either by coupling using one of the large area capacitors or directly by scratching through the BST layer with the probe tip. The C-V characteristics were measured using a HP4275A LCR meter at 100 KHz and 1 MHz using modulation voltages of 35 mV and 0.5V over a bias voltage range of −5V to +5V and 0V to 20V. The I-V characteristics were measured using a HP 4145B semiconductor parameter analyzer over the range of −5V to +5V. For a typical 10 mil diameter shadow mask capacitor, the capacitance ranged from 420 pF at 0V to 182 pF at 19V. The maximum leakage current was measured to be 100 nA at 5V.

Wire bonding and RF test.

One of the 10 mil varactors 16 (capacitors 31) and bottom electrode were gold ball wire bonded to an RF test fixture. The structure was analyzed using an RF impedance analyzer. Tests showed that the voltage variable dielectric capacitor 31 operates as expected.

FIG. 5 illustrates an exemplary embodiment of frequency regulating apparatus 30 in accordance with the principles of the present invention. The frequency regulating apparatus 30 comprises a voltage variable dielectric capacitor 31 or ferroelectric capacitor 31 that may be used in a high frequency power converter 10, for example. The voltage variable dielectric capacitor 31 comprises a substrate 32 having a bottom electrode 33 formed thereon. A dielectric material 34 is disposed on the substrate 32 and bottom electrode 33 that preferably comprises a crystallized ceramic material. The ceramic material may preferably be made of a mixture of decomposed barium, strontium, and titanium metal organic salts. A top electrode 35 is disposed on top of the crystallized ceramic material to complete the capacitor 31. This frequency regulating apparatus 30 or a voltage variable dielectric capacitor 31 may be preferably used as a thin film low voltage switchable varactor in a high frequency power converter, such as the VHF power converter disclosed in U.S. Pat. No. 5,708,573, for example.

Thus, an improved voltage variable capacitor or varactor for use in such high frequency resonant DC—DC converters. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A fixed frequency resonant converter comprising:
    a resonant inverter that outputs an unregulated source voltage;
    an impedance matching and isolation network coupled to the inverter that comprises a voltage variable dielectric varactor that converts the unregulated source voltage into a sinusoidal power waveform;
    a rectifier/filter coupled to the impedance matching and isolation network;
    an error amplifier for sensing the output of the converter and comparing the sensed output with a reference voltage to generate an error signal;
    a driver coupled to the error amplifier and the voltage variable dielectric varactor for generating a variable bias to control the varactor in response to the error signal.

2. The converter recited in claim 1 wherein the voltage variable dielectric varactor is connected in a series-shunt configuration.

3. The converter recited in claim 1 wherein the voltage variable dielectric varactor is connected in a series-parallel configuration.

4. The converter recited in claim 1 wherein the voltage variable dielectric varactor is connected in a parallel configuration.

5. The converter recited in claim 1 wherein the voltage variable dielectric varactor comprises:
    a substrate;
    a bottom electrode disposed on a surface of the substrate;
    a dielectric material disposed on an exposed surface of the bottom electrode; and
    a top electrode disposed on an exposed surface of the crystallized ceramic material;
    and wherein the bottom electrode and top electrode sandwich the dielectric material to form a voltage variable dielectric capacitor.

6. The converter recited in claim 5 wherein the dielectric material comprises a crystallized ceramic material.

7. The converter recited in claim 5 wherein the dielectric material comprises a barium strontium titanate thin film.

8. The converter recited in claim 6 wherein the crystallized ceramic material comprises a mixture of decomposed barium, strontium, and titanium metal organic salts.

9. The converter recited in claim 5 wherein the bottom electrode comprises a tantalum adhesion layer having a platinum layer disposed thereon.

10. The converter recited in claim 5 wherein the top electrode comprises platinum.

* * * * *